(12) United States Patent
Smelloy et al.

(10) Patent No.: US 7,518,164 B2
(45) Date of Patent: Apr. 14, 2009

(54) CURRENT-TRIGGERED LOW TURN-ON VOLTAGE SCR

(75) Inventors: Yossi Smelloy, Mitzpe Kamon (IL); Ronen Eckhouse, Shimshit (IL); Eyal Frost, Moshav Balfuria (IL)

(73) Assignee: Mellanox Technologies Ltd., Yokneam (IL)

(*) Notice: Subject to any disclaimer, the term of this patent is extended or adjusted under 35 U.S.C. 154(b) by 84 days.

(21) Appl. No.: 11/691,514

(22) Filed: Mar. 27, 2007

(65) Prior Publication Data

US 2007/0228410 A1 Oct. 4, 2007

Related U.S. Application Data

(60) Provisional application No. 60/786,732, filed on Mar. 29, 2006.

(51) Int. Cl.
*H01L 23/60* (2006.01)

(52) U.S. Cl. .................. 257/111; 257/173; 257/174; 257/E21.358

(58) Field of Classification Search ............... 257/173, 257/174, 111, E21.358
See application file for complete search history.

(56) References Cited

U.S. PATENT DOCUMENTS

| 4,926,138 A | | 5/1990 | Castello et al. | |
| 5,400,202 A | * | 3/1995 | Metz et al. | ............ 361/56 |
| 5,821,807 A | | 10/1998 | Brooks | |
| 6,268,992 B1 | | 7/2001 | Lee et al. | |

* cited by examiner

*Primary Examiner*—Ngan Ngo
*Assistant Examiner*—Benjamin Tzu-Hung Liu
(74) *Attorney, Agent, or Firm*—Mark M. Friedman

(57) ABSTRACT

A system for protecting a high-speed input/output pad of an integrated circuit. The system includes a preferably parasitic silicon controlled rectifier (SCR) and a triggering mechanism that preferably includes an NMOS triggering FET. The SCR includes an anode connected to the input/output pad and a trigger input. The anode and the trigger input form a reverse-biased junction that, during normal operation of the integrated circuit, isolates the triggering mechanism from the input/output pad when power is applied to the integrated circuit.

8 Claims, 2 Drawing Sheets

US 7,518,164 B2

1

CURRENT-TRIGGERED LOW TURN-ON VOLTAGE SCR

This is a continuation-in-part of U.S. Provisional Patent Application Ser. No. 60/786,732, filled Mar. 29, 2006

FIELD AND BACKGROUND OF THE INVENTION

The present invention relates to a system and method for protecting integrated circuits from electrostatic discharge (ESD) and, more particularly, to the firing of a silicon controlled rectifier (SCR), operative to provide a safe discharge path for the ESD current, via a low-voltage triggering mechanism. High speed input/output (I/O) buffers transmitting signals at data rates higher than 5 Gbps incorporate semiconductor devices having oxides as thin as 20-30 Angstrom. These oxides must be protected from ESD. In order not to diminish the electronic performance of these I/O buffers the ESD protection must introduce very little parasitic capacitance or serial resistance. The present invention presents an ESD protection solution that meets these requirements by utilizing a current-triggered low turn-on voltage parasitic SCR intrinsic to the semiconductor device.

Various attempts have been made to provide solutions for low-capacitance ESD protection using an SCR. U.S. Pat. No. 6,268,992 to Lee et al. describes a displacement current trigger SCR that uses AC currents that charge a capacitor for triggering the parasitic SCR. This solution introduces additional capacitance to the pad.

U.S. Pat. No. 5,400,202 to Metz et al. describes a trigger circuit having an NMOS triggering transistor for activating the SCR. The NMOS transistor itself may be harmed by the ESD event; in addition, the NMOS transistor introduces leakage current and also introduces voltage stress limitations.

There is thus a widely recognized need for, and it would be highly advantageous to have, a system and method for protecting integrated circuits from ESD without introducing additional capacitance to I/O pads or leakage currents, and with greater tolerance for voltage stress.

DEFINITIONS

As used herein, unless otherwise specified, the term "real estate" refers to surface area of an integrated circuit die.

SUMMARY OF THE INVENTION

According to the present invention there is provided a system for protecting an integrated circuit from an electrostatic discharge event at an input/output pad connected to the integrated circuit, the system including: (a) a silicon controlled rectifier including: (i) an anode operationally connected to the input/output pad, and (ii) a trigger input separate from the anode, and (b) a triggering mechanism operationally connected to the trigger input; and wherein the anode and the trigger input form a reverse-biased diode operative to isolate the triggering mechanism from the input/output pad when power is applied to the integrated circuit.

Preferably, the silicon controlled rectifier is operative to conduct at least a portion of a current caused by the electrostatic discharge event.

Preferably, the silicon controlled rectifier is parasitic.

Preferably, the anode includes a first p-type region, the trigger input includes a first n-type region, and the silicon controlled rectifier also includes a cathode and a second-p type region. The cathode includes a second n-type region. The first p-type region and the first n-type region form a first p-n junction. The first n-type region and the second p-type region form a second p-n junction. The second p-type region and the second n-type region form a third p-n junction.

Preferably, the triggering mechanism is operative, while power is not being applied to the integrated circuit, to trigger the silicon controlled rectifier to conduct at least a portion of a current caused by the electrostatic discharge event.

Preferably, the triggering mechanism includes an inverter, a resistor, a capacitor and a trigger transistor. The inverter is configured to be powered by the electrostatic discharge event. A first terminal of the resistor is connected to the trigger input. A second terminal of the resistor is connected to an input of the inverter. A first terminal of the capacitor is connected to the second terminal of the resistor. A second terminal of the capacitor is grounded. The trigger transistor has a drain connected to both the trigger input and a power supply line of the integrated circuit, a grounded source and a gate connected to an output of the inverter. A time constant of the resistor and the capacitor is great enough that when an electrostatic discharge event occurs at the input/output pad while power is not applied to the integrated circuit, a voltage at the input of the inverter remains sufficiently low for a sufficiently long time for a voltage at the output of the inverter to be sufficiently high to cause the trigger transistor to conduct a trigger current that is operative to trigger the silicon control rectifier. On the other hand, when power is applied to the integrated circuit, the capacitor is charged to a voltage sufficiently high to cause the voltage at the output of the inverter to be sufficiently low to cause the trigger transistor to be substantially non-conductive.

Preferably, the triggering mechanism includes a transistor that is operative, when an electrostatic discharge event occurs, to conduct a triggering current so as to trigger the silicon controlled rectifier. Most preferably, the transistor is a field effect transistor.

Preferably, the silicon controlled rectifier has a trigger voltage of at most about 1.2V.

According to the present invention there is provided a method for protecting an integrated circuit from an electrostatic discharge event at an input/output pad connected to the integrated circuit, the method including the steps of: (a) providing a silicon controlled rectifier including: (i) an anode operationally connected to the input/output pad, and (ii) a trigger input separate from the anode; and (b) operationally connecting a triggering mechanism to the trigger input; wherein a diode formed by the anode and the trigger input is reverse biased so as to isolate the triggering mechanism from the input/output pad.

Preferably, the diode is reverse biased when power is applied to the integrated circuit.

Preferably, the triggering mechanism is operative to trigger the silicon controlled rectifier to conduct at least a portion of a current caused by the electrostatic discharge even while power is not being applied to the integrated circuit.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a system and method, for protecting integrated circuits from ESD, that can be implemented with minimal real estate requirements, that introduces very little parasitic capacitance and that does not require serial resistance or additional NMOS devices.

The principles and operation of ESD protection according to the present invention may be better understood with reference to the drawings and the accompanying description.

Figure 1:
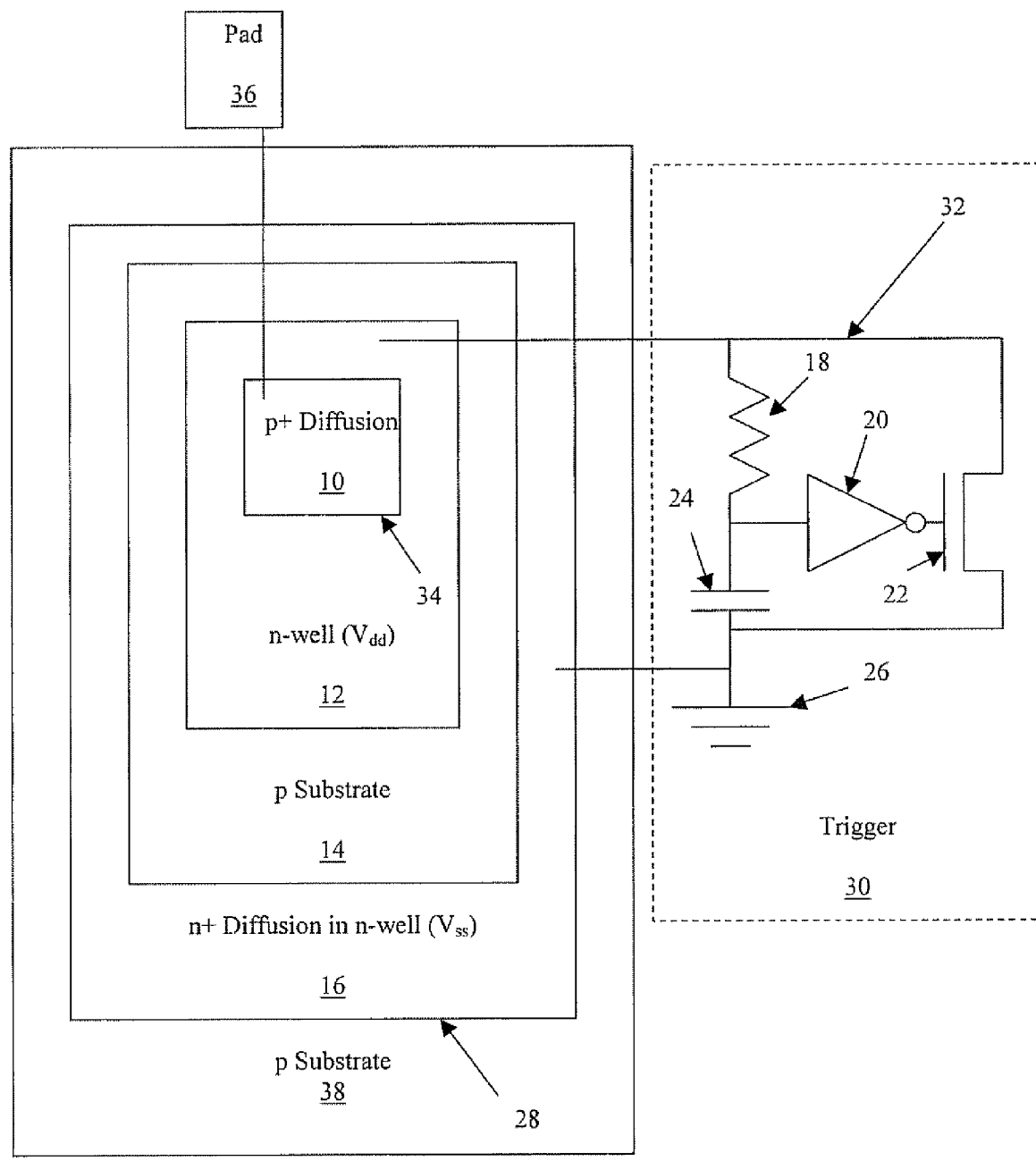
FIGS. 1 and 2 illustrate schematically a system for protecting an integrated circuit pad from an electrostatic discharge event, with the SCR shown in a plan view layout (not to scale) in FIG. 1 being represented in FIG. 2 by an equivalent circuit model.
Figure 2:
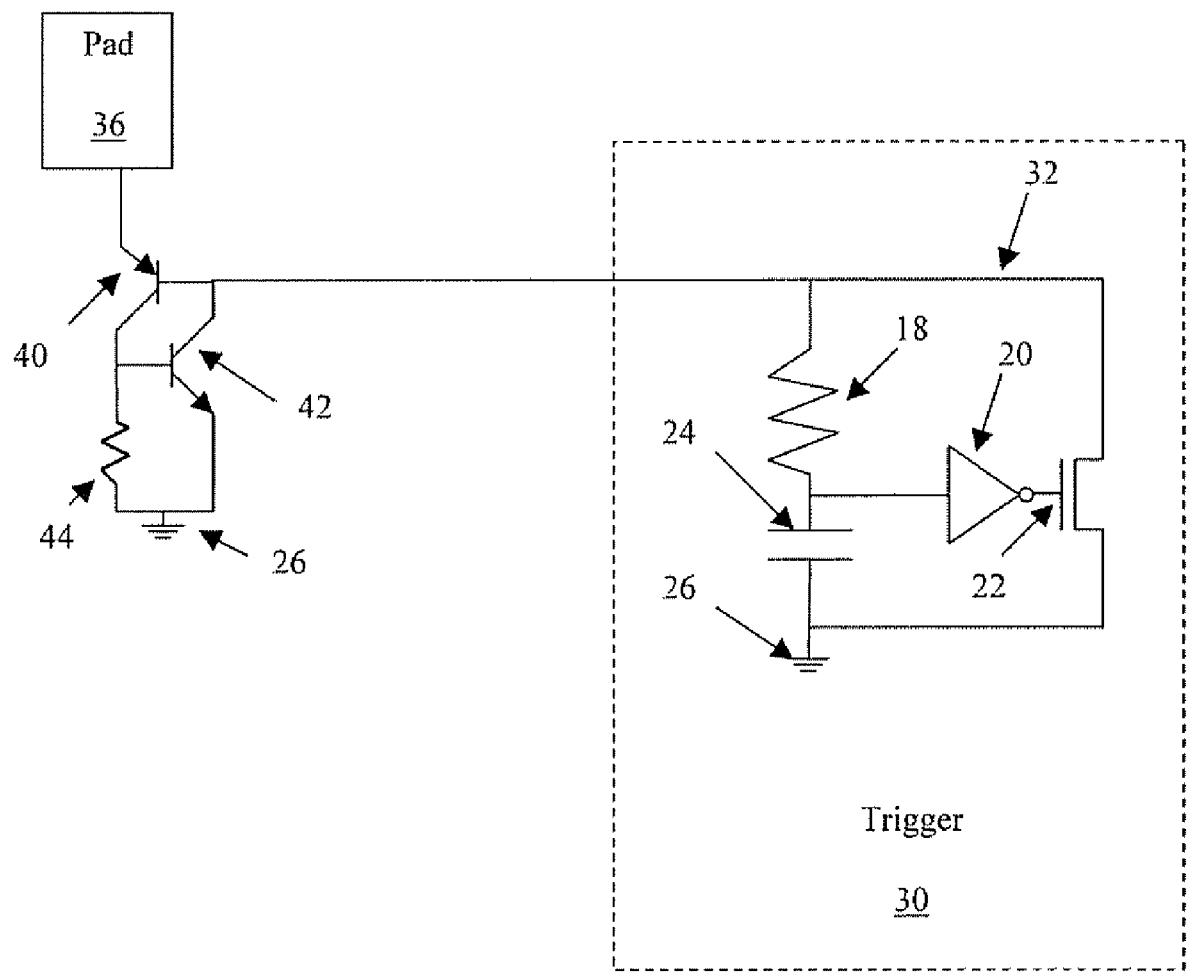

Referring now to the drawings, FIG. 1 illustrates schematically a layout of a preferred embodiment of the present invention wherein ESD protection is provided to an I/O pad 36 by an intrinsic parasitic SCR 28 triggered by a triggering circuit 30 indicated in FIG. 1 by a dashed box. Triggering circuit 30 is a preferred embodiment of the "triggering mechanism" of the appended claims. Superior ESD protection is afforded by providing low-voltage triggering of parasitic SCR 28, the triggering voltage being on the order of 1.2 Volt. Triggering at such low voltages is made possible by a triggering circuit 30 which causes components of SCR 28, modeled in FIG. 2 as a parasitic n-p-n bipolar transistor 40 and a parasitic p-n-p bipolar transistor 42, to conduct. Referring back to FIG. 1, a first SCR PN junction 34 is formed by a p+region 10 and an n-well 12. This junction 34 effectively acts as a diode connected between I/O pad 36 and power supply line 32. The triggering current is conducted by a transistor 22, able to sink a current of approximately 1 ampere, connected between power supply line 32 and ground 26.

Transistor 22 is preferably an NMOS field effect transistor (FET), because of the ease of fabrication of such FETs in CMOS technology and because of the high input impedance characteristic of an FET, and the following discussion is couched in terms appropriate to the use of an NMOS FET as transistor 22. However, transistor 22 can alternatively be another type of transistor, and the use of other types of transistors as transistor 22 is within the scope of the present invention. It will be readily apparent to those skilled in the art that, if transistor 22 is implemented as a bipolar transistor, the emitter, base and collector of the bipolar transistor respectively correspond to the source, gate and drain of the FET discussed herein.

When an ESD pulse raises the voltage of I/O pad 36, relative to power supply line 32, enough to cause the diode formed by junction 34 to conduct, the voltage on power supply line 32 increases. In an unpowered device capacitor 24 will not be charged, and thus the input of inverter 20 will be low at the moment the ESD pulse is applied, causing the output of inverter 20 to be high. Therefore, NMOS transistor 22 will be conductive. This large NMOS transistor 22 momentarily serves as a supply clamp to ground 26, necessitating that the width of NMOS transistor 22 be sufficient to sink a current of approximately 1 ampere, as mentioned above The current drawn by NMOS transistor 22 turns on parasitic SCR 28 which is operative to conduct the ESD current to ground 26, thereby protecting circuitry (not shown) connected to pad 36 from excessive voltage.

The ability of an SCR to carry more current per unit area than prior-art ESD protection diodes permits the diode formed by junction 34 between p+region 10 and n-well 12 to be very small in comparison with prior-art ESD protection diodes, diode junction 34 of the present invention having a typical capacitance on the order of 50 femtofarad when p+region 10 has typical dimensions of 50 μm by 2 μm. The diode formed by junction 34 effectively becomes a part of parasitic SCR 28 which conducts straight to ground. Therefore, under normal operating conditions, during which the diode formed by junction 34 is reverse-biased, the parasitic capacitance added to pad 36 is very small. In addition, due to the low turn-on voltage, an input buffer (not shown) fed by pad 36 does not require a protective series resistor connected between pad 36 and the input of the input buffer. Moreover, no NMOS transistor needs to be connected directly to pad 36. Instead, NMOS transistor 22 is isolated from pad 36 during normal operation by the reverse-biased diode formed by junction 34.

In a system according to the present invention a heavily doped p-type (p+) region 10 connected to I/O pad 36 is inside an n-type well (n-well) 12 connected to power supply line 32. Power supply line 32 is connected to ground 26 through large NMOS FET 22. If an ESD event causes the power supply line voltage to increase rapidly in an unpowered device according to the present invention, NMOS FET 22 turns on and draws current from power supply line 32 and from the diode formed by junction 34.

In parasitic SCR 28, p+region 10 functions as an anode, n-well 12 functions as a trigger input, and an additional n-well 16 functions as a cathode.

Parasitic SCR 28 operates as follows: The diode formed by junction 34 between p+region 10 and n-well 12, together with the portion 14 of substrate 38 that surrounds n-well 12, form a first bipolar PNP transistor (40 in FIG. 2). Current is drawn by triggering circuit 30 from the base 12 of this transistor, causing an emitter-collector current to flow. NPN transistor (42 in FIG. 2) is formed by n-well 12 (collector), portion 14 of substrate 38 (base), and additional n-well 16 (emitter) which is connected to ground 26 and is placed close to the diode formed by junction 34. Portion 14 of substrate 38 should be sufficiently wide, typically 1 μm, and at least 0.2 μm in current technologies, such that the current in portion 14 of substrate 38 raises the voltage of portion 14 of substrate 38, which acts as the base of NPN transistor (42 in FIG. 2), sufficiently to cause NPN transistor (42 in FIG. 2) to conduct. Once SCR 28 is turned on SCR 28 provides a low-resistance path from pad 36 to ground 26.

Unintentional latch-up of SCR 28 during normal functioning of the integrated circuit is prevented by the connection of power supply line 32 to a power supply having a voltage higher than the voltages present, during normal functioning, on pad 36, causing the diode formed by junction 34 to be reverse-biased. This reverse-biasing of junction 34 also prevents triggering circuit 30 from loading pad 36 during normal operation of the integrated circuit.

While the invention has been described with respect to a limited number of embodiments, it will be appreciated that many variations, modifications and other applications of the invention may be made.

What is claimed is:

1. A system for protecting an integrated circuit from an electrostatic discharge event at an input/output pad connected to the integrated circuit, the system comprising:
   (a) a silicon controlled rectifier including:
      (i) an anode operationally connected to the input/output pad, and
      (ii) a trigger input separate from said anode, and
   (b) a triggering mechanism operationally connected to said trigger input, said triggering mechanism including:
      (i) an inverter configured to be powered by the electrostatic discharge event, (ii) a resistor having a first terminal connected to said trigger input and a second terminal connected to an input of said inverter, (iii) a capacitor having a first terminal connected to said second terminal of said resistor and a second, grounded terminal, and (iv) a trigger transistor having a drain connected to said trigger input and also connected to a power supply line of the integrated circuit, a grounded source, and a gate connected to an output of said inverter;

wherein a time constant of said resistor and said capacitor is great enough that when an electrostatic discharge event occurs at the input/output pad while power is not applied to the integrated circuit, a voltage at said input of said inverter remains sufficiently low for a sufficiently long time for a voltage at said output of said inverter to be sufficiently high to cause said trigger transistor to conduct a trigger current operative to trigger said silicon control rectifier;

wherein, when power is applied to the integrated circuit, said capacitor is charged to a voltage sufficiently high to cause said voltage at said output of said inverter to be sufficiently low to cause said trigger transistor to be substantially non-conductive;

and wherein said anode and said trigger input form a reverse-biased diode operative to isolate said triggering mechanism from the input/output pad when power is applied to the integrated circuit.

2. The system of claim 1, wherein said silicon controlled rectifier is operative to conduct at least a portion of a current caused by the electrostatic discharge event.

3. The system of claim 1, wherein said silicon controlled rectifier is parasitic.

4. The system of claim 1, wherein said anode includes a first p-type region; wherein said trigger input includes a first n-type region; wherein said silicon controlled rectifier further includes:

(iii) a cathode that includes a second n-type region, and (iv) a second p-type region;

and wherein said first p-type region and said first n-type region form a first p-n junction, said first n-type region and said second p-type region form a second p-n junction, and said second p-type region and said second n-type region form a third p-n junction.

5. The system of claim 1, wherein said triggering mechanism is operative, while power is not being applied to the integrated circuit, to trigger said silicon controlled rectifier to conduct at least a portion of a current caused by the electrostatic discharge event.

6. The system of claim 1, wherein said triggering mechanism includes a transistor operative, when an electrostatic discharge event occurs, to conduct a triggering current so as to trigger said silicon controlled rectifier.

7. The system of claim 6, wherein said transistor is a field effect transistor.

8. The system of claim 1, wherein said silicon controlled rectifier has a trigger voltage of at most about 1.2V.

* * * * *